United States Patent
Yang et al.

(10) Patent No.: US 7,808,082 B2
(45) Date of Patent: Oct. 5, 2010

(54) STRUCTURE AND METHOD FOR DUAL SURFACE ORIENTATIONS FOR CMOS TRANSISTORS

(75) Inventors: Haining Yang, Wappingers Falls, NY (US); Thomas W. Dyer, Pleasant Valley, NY (US); Keith Kwong Hon Wong, Wappingers Falls, NY (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 316 days.

(21) Appl. No.: 11/559,571

(22) Filed: Nov. 14, 2006

(65) Prior Publication Data
US 2008/0111162 A1    May 15, 2008

(51) Int. Cl.
*H01L 21/335* (2006.01)
(52) U.S. Cl. .............................. 257/627; 257/E33.003; 438/142
(58) Field of Classification Search ................. 257/627, 257/E33.003; 438/142
See application file for complete search history.

(56) References Cited

U.S. PATENT DOCUMENTS

| | | | | |
|---|---|---|---|---|
| 5,494,179 | A * | 2/1996 | Hori et al. | 216/11 |
| 5,545,436 | A * | 8/1996 | Saito | 427/255.37 |
| 6,127,623 | A * | 10/2000 | Nakamura et al. | 136/256 |
| 7,060,585 | B1 | 6/2006 | Cohen et al. | |
| 7,102,166 | B1 | 9/2006 | Bryant et al. | |
| 2004/0058494 | A1 * | 3/2004 | Choi et al. | 438/257 |
| 2004/0229476 | A1 * | 11/2004 | Kobayashi et al. | 438/775 |
| 2005/0236700 | A1 * | 10/2005 | Ghyselen et al. | 257/676 |
| 2006/0001093 | A1 * | 1/2006 | Yamashita | 257/347 |
| 2006/0003554 | A1 * | 1/2006 | Zhu et al. | 438/479 |
| 2006/0118918 | A1 | 6/2006 | Waite et al. | |
| 2006/0194421 | A1 | 8/2006 | Ieong et al. | |

OTHER PUBLICATIONS

Chang, Leland et al., "CMOS Circuit Performance Enhancement by Surface Orientation Optimization", IEEE Transactions on Electron Devices, Oct. 2004, pp. 1621-1627, vol. 51, No. 10.

* cited by examiner

*Primary Examiner*—Thao X Le
*Assistant Examiner*—Matthew Gordon
(74) *Attorney, Agent, or Firm*—Scully, Scott, Murphy & Presser, P.C.; H. Daniel Schnurmann

(57) ABSTRACT

The present invention provides structures and methods for providing facets with different crystallographic orientations than what a semiconductor substrate normally provides. By masking a portion of a semiconductor surface and exposing the rest to an anisotripic etch process that preferentially etches a set of crystallographic planes faster than others, new facets with different surface orientations than the substrate orientation are formed on the semiconductor substrate. Alternatively, selective epitaxy may be utilized to generate new facets. The facets thus formed are joined to form a lambda shaped profile in a cross-section. The electrical properties of the new facets, specifically, the enhanced carrier mobility, are utilized to enhance the performance of transistors. In a transistor with a channel on the facets that are joined to form a lambda shaped profile, the current flows in the direction of the ridge joining the facets avoiding any inflection in the direction of the current.

16 Claims, 13 Drawing Sheets

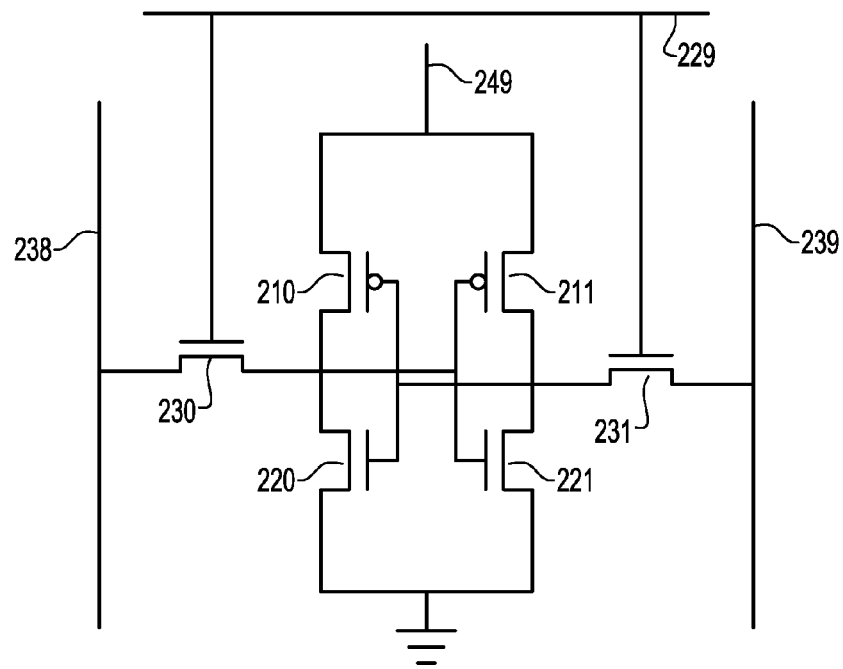
FIG. 2 (PRIOR ART)
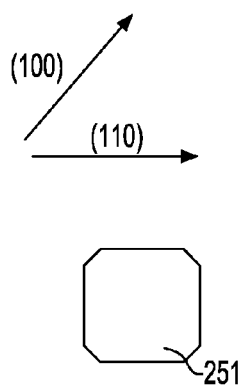
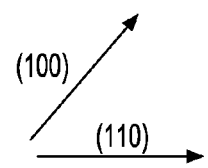
FIG. 3A
FIG. 3B

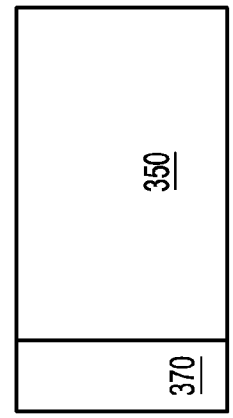
FIG. 7C
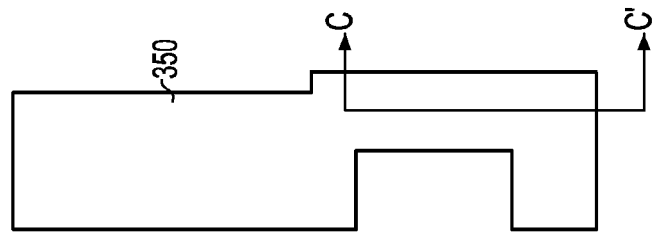
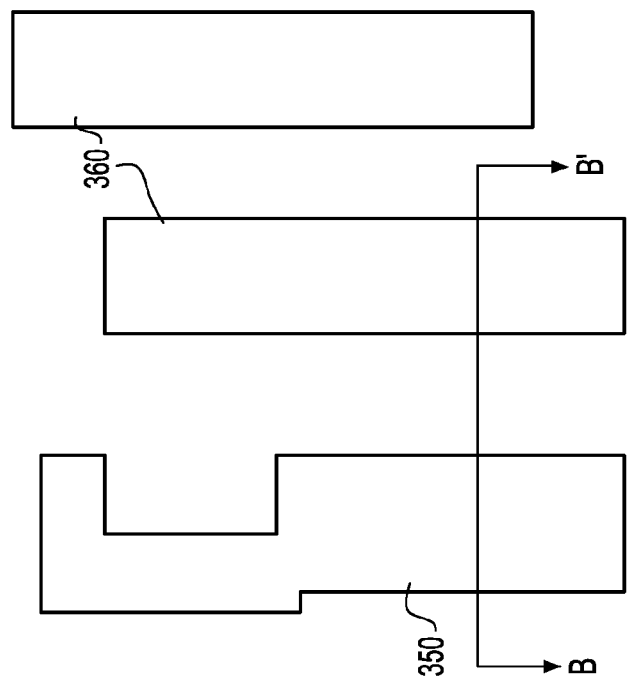
FIG. 7A
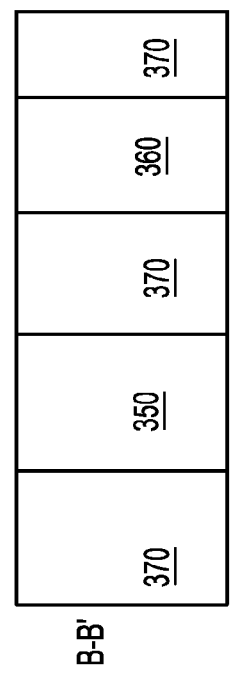
FIG. 7B

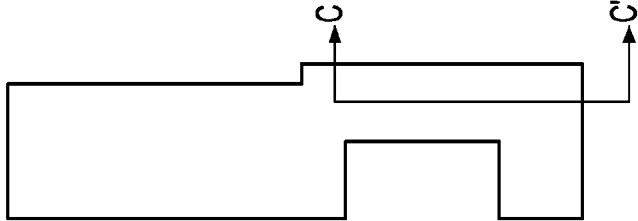
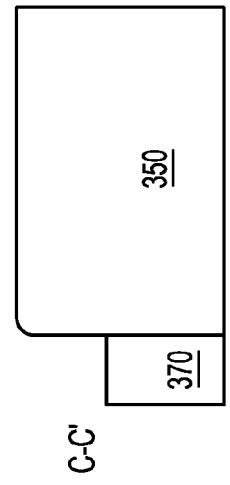
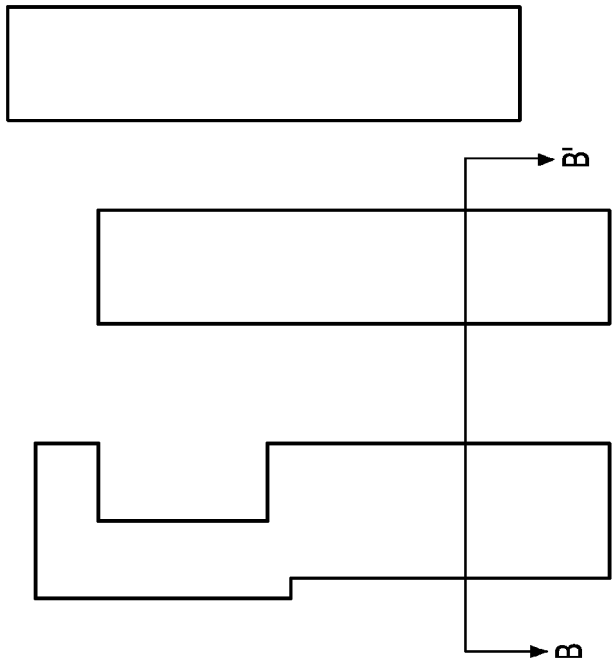
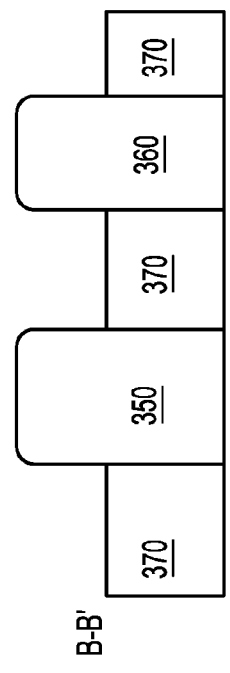
FIG. 8A
FIG. 8B
FIG. 8C

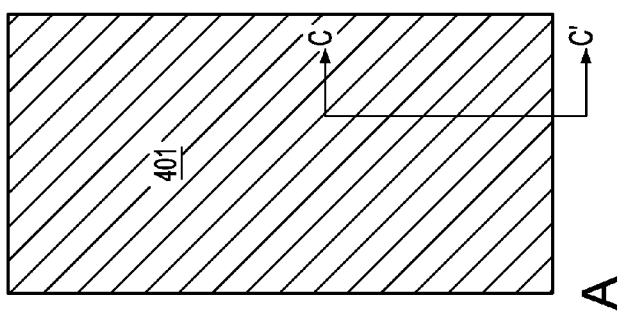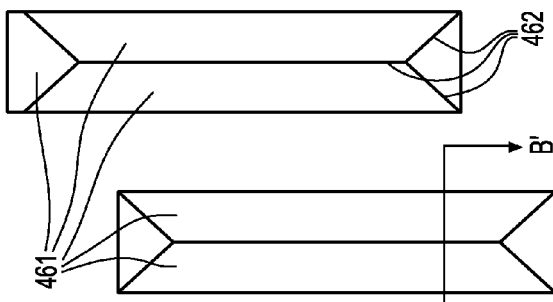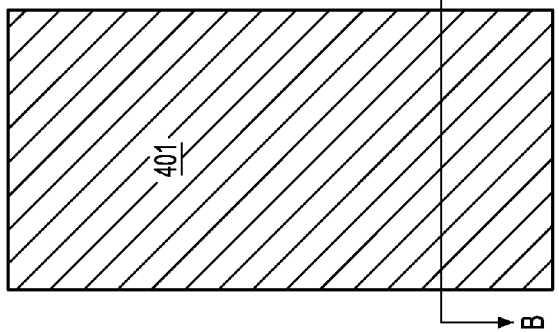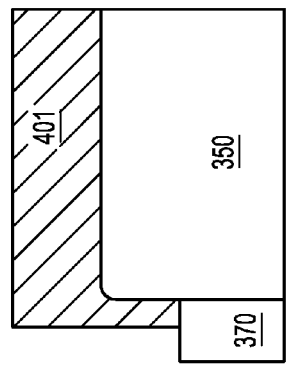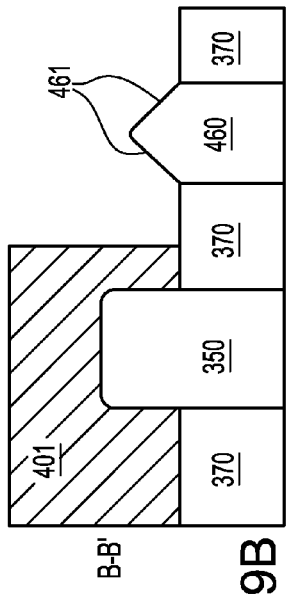
FIG. 9A
FIG. 9B
FIG. 9C

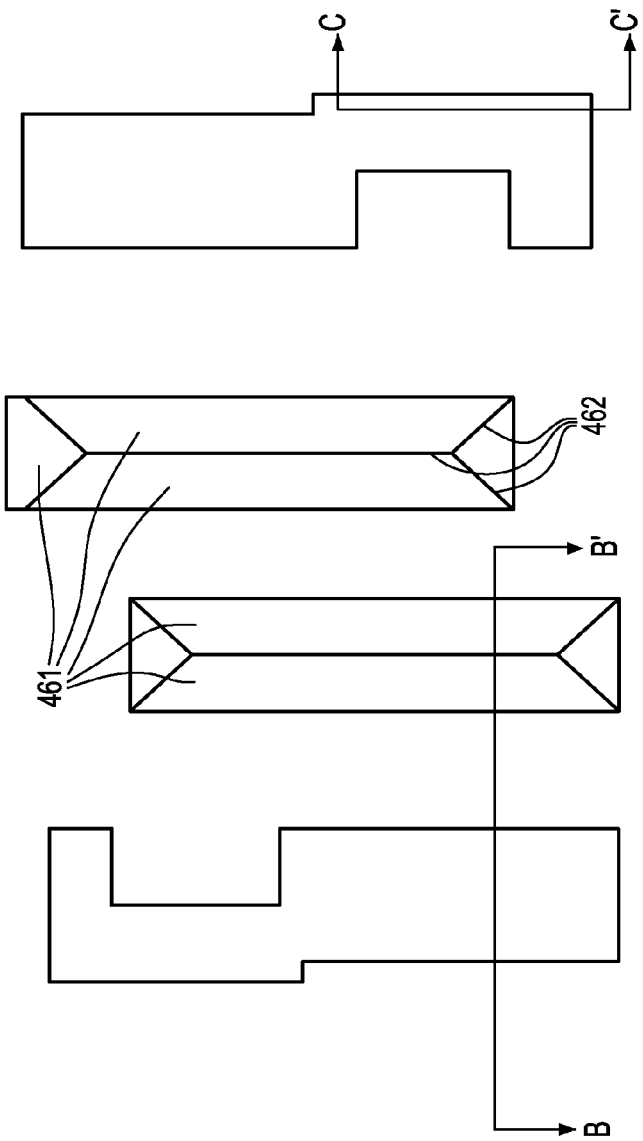
FIG. 10A
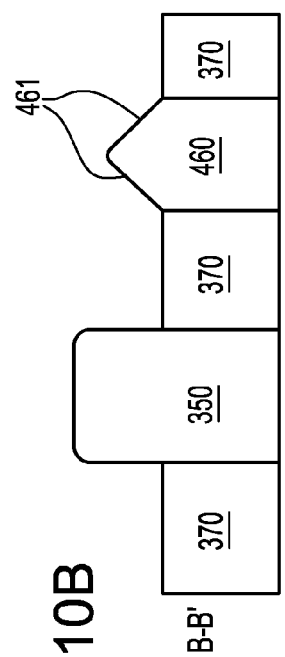
FIG. 10B
FIG. 10C

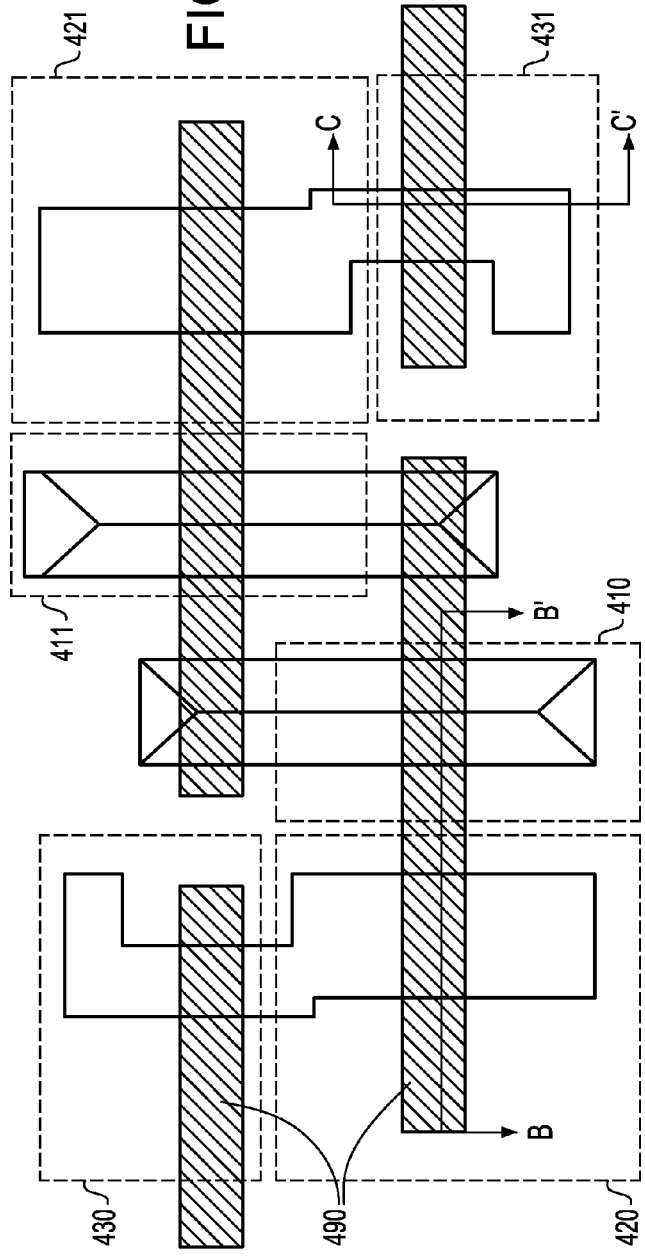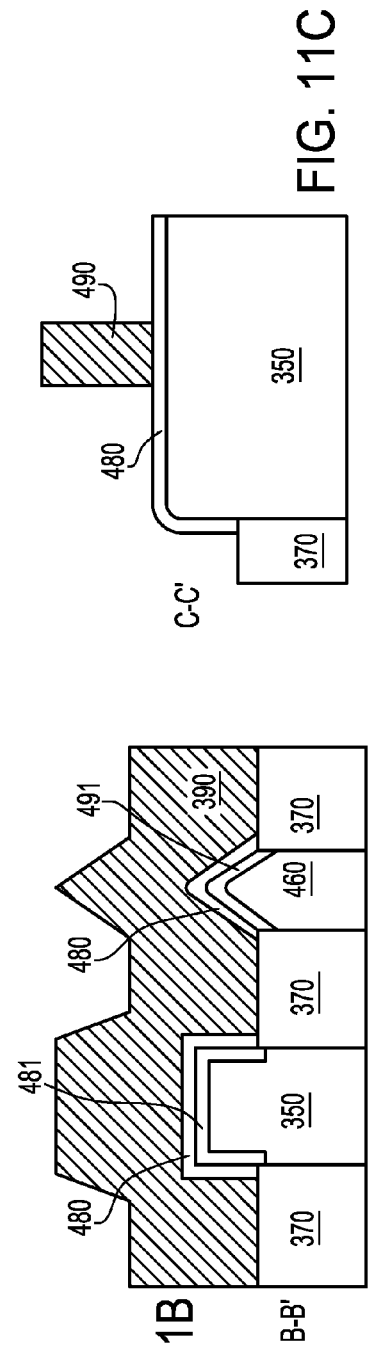

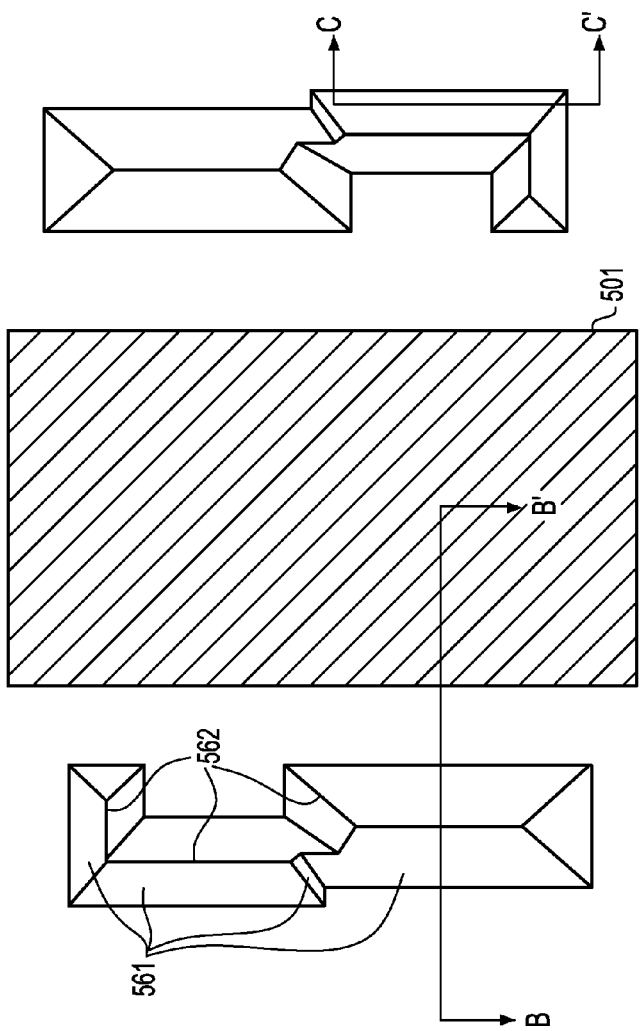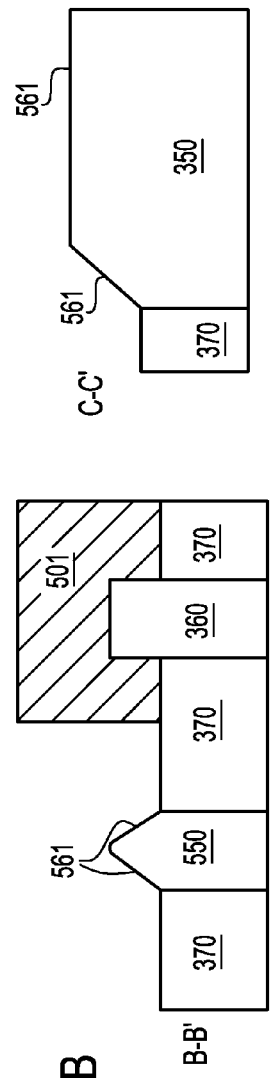

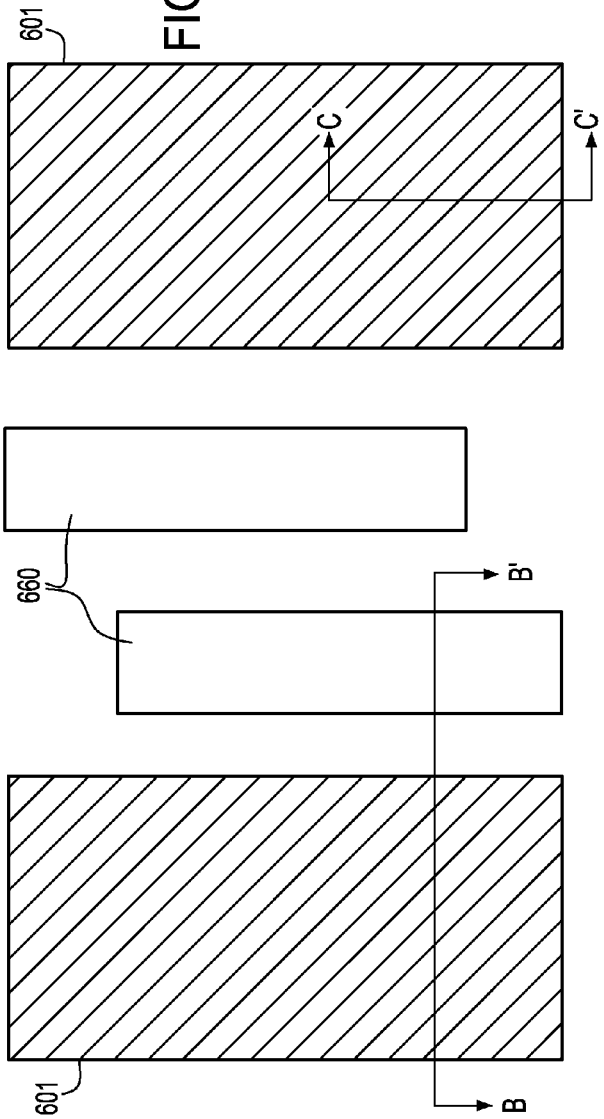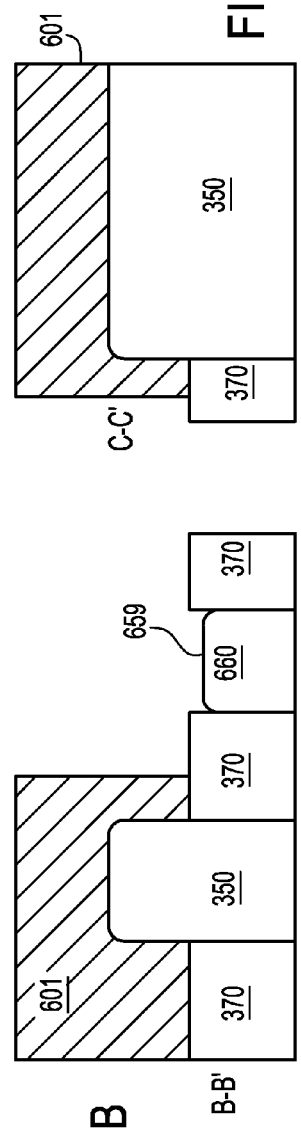

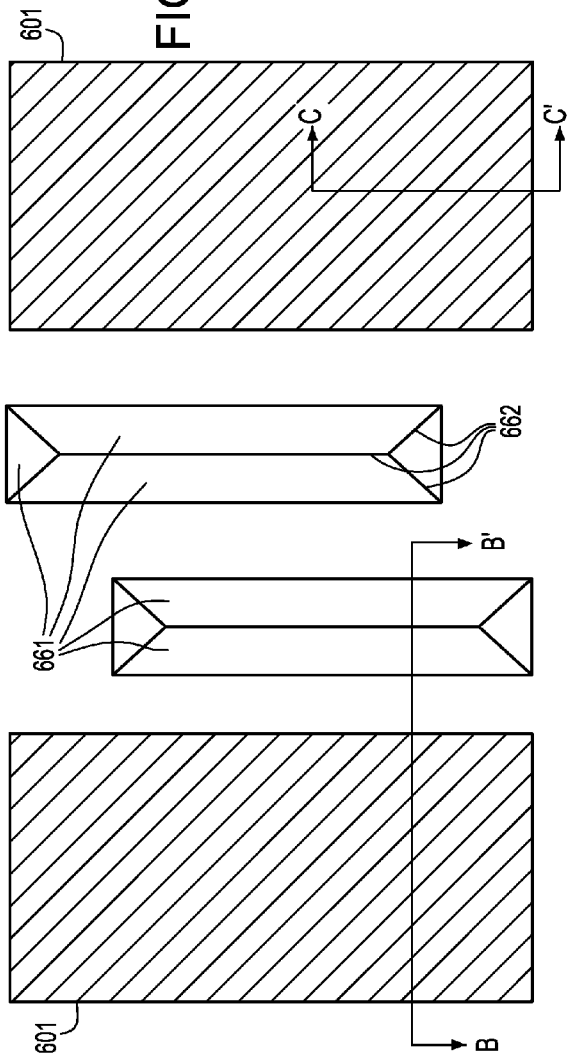
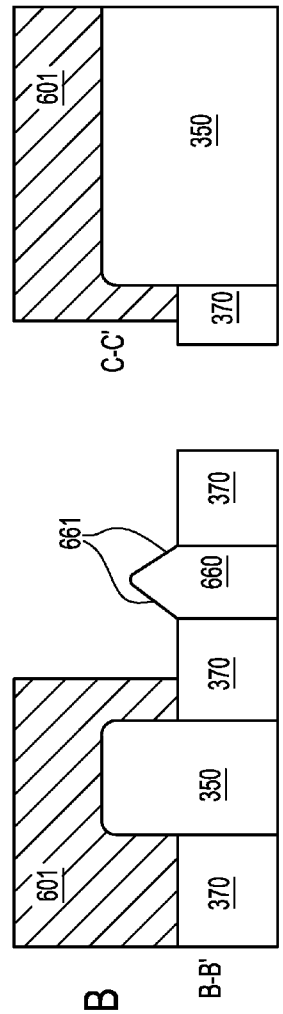
FIG. 14A
FIG. 14B
FIG. 14C

STRUCTURE AND METHOD FOR DUAL SURFACE ORIENTATIONS FOR CMOS TRANSISTORS

FIELD OF THE INVENTION

The present invention relates to semiconductor devices, and particularly, to complementary metal oxide semiconductor (CMOS) transistors.

BACKGROUND OF THE INVENTION

In each new generation of semiconductor technology, transistor current decreases due to gate width reduction, mobility degradation of minority carriers, and reduction of the supply voltage Vdd. Reduced transistor current results in deterioration of circuit stability and reduces the speed of circuit operation thereby causing degradation in performance. One of the key parameters determining the mobility of minority carriers is the crystallographic surface orientation on which the channel of the transistor is built. Therefore, the crystallographic orientation of the surface, or the surface orientation of a transistor structure plays a key role in determining the performance of the transistor.

Specifically, the electron mobility in silicon is the highest for the {100} surface orientation and the lowest for the {110} surface orientation, while the hole mobility is the highest for the {110} surface orientation and the lowest for the {100} surface orientation within silicon single crystal. Recent studies by Chang et al., "CMOS Circuit Performance Enhancement by Surface Orientation Optimization," IEEE Transaction on Electron Devices, Vol. 51, No. 10, October 2004, pp. 1621-1627 demonstrate that the overall circuit performance may be enhanced by utilizing a silicon substrate of an alternate surface orientation than the {100} surface orientation that the semiconductor industry has traditionally used.

While the performance of the overall circuit can be optimized by selecting the optimal substrate orientation to make tradeoffs between the PFET and NFET performance as demonstrated by Chang et al., the performance of the overall circuit may be enhanced even more by the use of different crystallographic planes for the PFET and NFET devices. This class of technology, called "hybrid orientation technology (HOT)" in the industry, provides methods of manufacturing PFET devices and NFET devices on different crystallographic planes on the same substrate.

One such example, U.S. Pat. No. 7,102,166 B1 to Bryant et al., discloses a method in which two wafers with different wafer surface orientations are bonded together to provide a structure having different crystallographic planes on the surface. The bonding step is followed by silicon epitaxy to create a flat wafer surface with two different surface orientations. A second such example, U.S. Patent Application Publication No. US2006/0194421 A1 by Ieong et al., discloses a similar approach in which the etching of the pattern on the bonded wafer stops at the buried oxide layer and then windows in the buried oxide layer are utilized to perform an epitaxy to regrow a crystal surface with the same surface orientation as the underlying substrate. A third such example, U.S. Patent Application Publication No. US2006/0118918 A1 by Waite et al., provides structures and methods for multiple stacked hybrid orientations by utilizing multiple wafer bonding processes and epitaxial growth of silicon. A fourth example, U.S. Pat. No. 7,060,585 B1 to Cohen et al., utilizes wafer bonding but does not utilize epitaxy. Instead, a recrystallization process is utilized to create surface areas with different surface orientation.

A first general disadvantage of this type of approach is that the process of manufacture is prone to defect generation. In particular, the epitaxial growth process that the prior art refers to involves selective epitaxial growth of silicon, that is, the silicon material nucleates and grows on silicon surfaces while the exposed dielectric surface is not supposed to nucleate silicon material. However, general difficulty in controlling the defect level in the selective epitaxy is known in the industry. Even the use of recrystallization faces the challenge of generation of a boundary between two different surface orientations, where two different crystallographic orientations meet and generate substantial number of crystalline defects.

A second general disadvantage of this type of approach described above is that as a consequence of a high level of defect density near the boundaries, irrespective whether epitaxy is used or recrystallization is used, a substantial portion of the surface area becomes unusable for high performance CMOS devices. This is because crystalline defects cause leakages in the CMOS transistors which, in turn, degrade the transistor performance. To be able to utilize a high percentage of the surfaces provided on the substrate, the boundary between the areas with different surface orientations needs to be minimized. This limits the flexibility in the layout of the CMOS circuitry. The PFET devices need to be clustered in the layout in one area and the NFET devices need to be clustered in another area of the layout. In other words, the size of each area of the same surface orientation needs to be sizable to allow the utilization of the available total surface area. However, since a high performance CMOS circuit requires fast signal propagation between the components, this limitation severely degrades overall circuit performance.

A third general disadvantage of this type of approach described above is that the processes are complex and costly. The complexity of the processes often requires narrow tolerance on process variables and thus, places a heavy burden on the process control. Also, they tend to increase the total cost of production of the devices.

While the benefits of the multiple surface orientations on the performance of CMOS devices are well known, the process of manufacturing known in the prior art poses severe restrictions and challenges in terms of the defect density generation, limitation on the size of each surface area with the same surface orientation, and the complexity and cost of the manufacture process.

Therefore, there exists a need for a semiconductor manufacturing process that produces multiple surface orientations with a low defect density. Also, there exists a need for a semiconductor manufacturing process that does not pose any limitation or pose as little limitation as possible on the size of each semiconductor area with the same surface orientation. Furthermore, there exists a need for a simplified and economical method of providing multiple surface orientations on the same semiconductor wafer.

SUMMARY OF THE INVENTION

The present invention addresses the needs described above and provides methods of achieving enhanced CMOS device performance with minimized negative consequences of the manufacture process.

Specifically, the present invention provides multiple surface orientations on a silicon substrate with a reduced defect density.

The present invention also enables the physical implementation of multiple surface orientations within close proximity among themselves so that the wiring delay between the devices utilizing the different surface orientations is minimized to enhance circuit performance.

Furthermore, the present invention increases the area available for the manufacture of high performance CMOS devices while providing multiple surface orientations on a silicon substrate through processes that do not render unusable the areas around the boundary between different surface orientations or minimize such unusable area.

Additionally, the present invention provides simplified processes of manufacture for such structures to reduce the complexity and cost.

While this disclosure uses bulk silicon substrate to describe the invention, it should be recognized that the present invention can equally well be practiced on a silicon-on-insulator (SOI) substrate, a silicon substrate with a relaxed deposited thick layer of material as a $Si_{1-x}Ge_x$ layer, a $Si_{1-x}C_x$ layer, or a $Si_{1-x-y}Ge_xC_y$ layer on the top of the substrate. Furthermore, the present invention is also compatible with a Si:C substrate. Such a substrate is typically obtained by substitutionally replacing about 0.5% to 4% of the silicon atoms with carbon atoms in a silicon substrate. This type of material is typically deposited by epitaxy and consequently, epitaxially aligned to the underlying substrate, that is, forms part of the same crystalline structure. The materials that can be epitaxially grown on the underlying substrate include intrinsic silicon, intrinsic silicon germanium alloy, intrinsic silicon carbon alloy, intrinsic silicon germanium carbon alloy, P-doped silicon, P-doped silicon germanium alloy, P-doped silicon carbon alloy, P-doped silicon germanium carbon alloy, N-doped silicon, N-doped silicon germanium alloy, N-doped silicon carbon alloy, and N-doped silicon germanium carbon alloy. Also, given suitable chemicals to effect preferential etching as will be described below, the present invention may also be utilized on a III-V compound semiconductor substrate as well as a II-VI compound semiconductor substrate.

The present invention is described with figures for a specific SRAM cell structure that utilizes two PFETs and four NFETs. This is because the set of challenges facing the enhancement of SRAM performance is a comprehensive example of the challenges facing the overall improvement of a large semiconductor circuit in general. For example, the transistors in an SRAM cell need to be high performance devices despite their small size, therefore requiring high mobility of the minority carriers in the channel. At the same time, the transistors require small off current, or small leakage current, which in turn requires a low level of defect density in the semiconductor substrate, especially in the channel. Also, due to the need to place PFETs and NFETs within a close proximity of one another, unusable area due to the defects generated from the boundary between areas of different crystallographic orientation needs to be minimized or better yet, eliminated. Also, SRAM devices are very common in semiconductor industry and many CMOS processes are developed around optimizing the SRAM performance.

Despite the fact that the main body of this disclosure is described using a specific SRAM layout, however, it should be recognized by those skilled in the art that the PFET area and NFET area in the description can be applied to any PFET or any NFET on the substrate. Thus, the present invention applies to any CMOS device that may utilize the benefits of having multiple surface orientations for other types of semiconductor devices.

The etch rate of a semiconductor material may be dependent on the crystallographic orientation of the surface being etched, i.e., the surface orientation of the substrate may affect the etch rate of the semiconductor material. An example of this phenomenon is observed during the deep trench etching process used in DRAM manufacturing. Despite the oval shape of the aperture on the resist and in the cross-sectional area of the deep trench near the top of the substrate, the cross-sectional area near the bottom of the deep trench changes to a rectangular shape due the preferential etching of one crystallographic plane, or surface orientation over another during the reactive ion etching (RIE) process. The resulting inner sidewall surface of deep trench toward the bottom substantially consists of surface orientations which have the lowest etch rate during the RIE process among all possible orientations for the sidewall surface. In another perspective, the rectangular shape in the cross-sectional profile can thus be considered as four facets of the silicon material with the lowest etch rate for the etchants provided during the RIE process.

Dependency of the etch rate of wet etching chemicals on the crystallographic orientations of the surface of semiconductors has also been observed. In fact, even examples of engineering the wet etch chemistry to select the preferred orientations of the facet, or the resulting semiconductor surface, has been demonstrated in "Anisotropic Etching of Surfactant-Added TMAH Solution," MEMS '99, January 1999, pp. 650-655, Sekimura. According to Sekimura, preferred orientations of the facet is engineered by adding surfactant to the wet etching chemical to achieve differences in the etch rate of the silicon by more than one order of magnitude.

Additionally, an alternative method of selecting the preferred orientations of the etched semiconductor surface by changing the surface treatment has also been demonstrated. In one example, the sidewalls of deep trenches were subjected to different surface pretreatment and then subjected to the same wet etching chemicals, specifically, dilute hydrogen fluoride (DHF) followed by ammonium hydroxide ($NH_4OH$). Different pretreatment of the surface resulted in different facets on the sidewalls of the deep trenches after the wet etch.

Surface orientations of semiconductor material that are at an angle with the substrate orientation, that is, the original surface orientation of the substrate surface, may also be obtained by a selective epitaxy process as well.

In this process, a new semiconducting material is epitaxially grown, i.e., grown preserving the crystallographic orientations of the underlying layer, only on an exposed semiconductor surface. A portion of the semiconductor substrate is masked with a masking material before the selective epitaxy process.

The present invention utilizes the phenomena described above to create local surface orientations different from the original surface orientation of the substrate surface, or the substrate orientation. Specifically, areas of the substrate where the original surface orientation is preferred for the devices to be built are covered with a mask resistant to the etchants to be used during the etching process. The rest of the semiconductor surface is subjected to the etchants during the etching process. An anisotropic etching process that produces different etch rates for different crystallographic orientations of the exposed surface is employed to produce facets with the least etch rate for the given etching process from the exposed silicon surface.

A critical feature of the present invention is that the geometry of semiconductor surfaces subjected to the etchants is chosen such that a pair of parallel edges of an exposed semiconductor surface creates a pair of facets with an inverted V shaped profile, or a "lambda shaped profile." The channel, formed beneath the pair of facets with the lambda shaped profile, also has another lambda shaped profile. The importance of the lambda shaped profile is manifold. First, the crystallographic plane of the surface is a different orientation than the substrate orientation. Preferably, the new crystallographic plane of the pair of facets in a lambda shaped profile is one that provides a higher carrier mobility for the transistor to be built on it. Second, it increases the area of the channel by a factor of the inverse of the cosine of the angle of the facets, thereby increasing the on-current of the transistor built on it. Third, a lambda shaped profile does not require any changes in the height of the surrounding STI and minimizes the variations in the height of exposed semiconductor surface. This point is illustrated by comparing a lambda shaped profile of a semiconductor surface to a single facet semiconductor surface with the same angle to the substrate and the same total length and surface area. To produce the same surface area with other constraints being equal, a single facet surface requires twice as much variation in the height of the semiconductor surface compared to a semiconductor surface with a lambda shaped profile. The inflection of the surfaces at the ridge where the two facets meet provides a mechanism of minimizing the height variation, thus alleviating the need for an increased depth of focus during the lithographic patterning of the surfaces.

According to the present invention, the current flows along the pair of parallel edges and perpendicular to the cross-section that contains the lambda shape profile of the surfaces and of the channel. The physical channel is formed of two facets and a ridge in the middle. The cross-section of the channel perpendicular to the direction of the current has a lambda shaped profile After stripping the masking material, the masked portion of the substrate still has the original surface orientation which is the same as the surface orientation but the portion of the substrate that was not masked during the anisotropic etching process is provided with surface orientations that are at an angle substantially greater than zero degree to the substrate orientation. Gate dielectric is formed on all the exposed semiconductor surfaces. One type of FET is built on a portion of the substrate with the original surface orientation and another type of FET is built on another portion of the substrate with surface orientations at an angle substantially greater than zero degree to the substrate orientation. In general, PFETs are built on {110} surfaces, while NFETs are built on {100} surfaces to utilize the benefit of high mobility of channel built under such surfaces.

In the first embodiment of the invention, the substrate is a single crystalline (100) substrate. Since the (100) substrate orientation is already an optimal surface for NFET mobility, NFET areas are masked during the etching step according to the present invention. Alternate surface orientations that are at an angle substantially greater than zero degree to (100) and are substantially not orthogonal to (100), preferably are in {110} orientations, are obtained on the portion of the substrate for the PFET devices. Each of the resulting PFETs have a channel built under the alternate surfaces, preferably under {110} surfaces.

In the second embodiment of the invention, the substrate is a single crystalline (110) substrate. Since the (110) substrate orientation is already an optimal surface for PFET mobility, PFET areas are masked during the etching step according to the present invention. Alternate surface orientations that are at an angle substantially greater than zero degree to (110) and are substantially not orthogonal to (110), preferably are in {100} orientations, are obtained on the portion of the substrate for the NFET devices. Each of the resulting NFETs have a channel built under the alternate surfaces, preferably under {100} surfaces.

In the third embodiment of the present invention, the substrate is a single crystalline (100) substrate. Since the (100) substrate orientation is already an optimal surface for NFET mobility, NFET areas are masked during the etching step according to the present invention. Optionally, the substrate material in the PFET area may be recessed at this point. A new substrate material is epitaxially grown by selective epitaxy from the exposed substrate material with facets in alternate surface orientations that are at an angle substantially greater than zero degree to (100) and are substantially not orthogonal to (100), preferably are in {110} orientations, are obtained on the portion of the substrate for the PFET devices. Each of the resulting PFETs have a channel built under the alternate surfaces, preferably under {110} surfaces.

In the fourth embodiment of the present invention, the substrate is a single crystalline (110) substrate. Since the (110) substrate orientation is already an optimal surface for PFET mobility, PFET areas are masked during the etching step according to the present invention. Optionally, the substrate material in the NFET area may be recessed at this point. A new substrate material is epitaxially grown by selective epitaxy from the exposed substrate material with facets in alternate surface orientations that are at an angle substantially greater than zero degree to (110) and are substantially not orthogonal to (110), preferably are in {100} orientations, are obtained on the portion of the substrate for the PFET devices. Each of the resulting PFETs have a channel built under the alternate surfaces, preferably under {100} surfaces.

BRIEF DESCRIPTION OF THE DRAWINGS

FIG. 2 is a circuit schematic of the prior art SRAM structure shown in FIG. 1A.

FIG. 3A is a schematic top-down view of a silicon surface etched with a circular mask island in a pure TMAH solution as described in the Sekimura article along with arrows denoting crystallographic orientations.

FIG. 3B is a schematic top-down view of a silicon surface etched with a circular mask island in a 0.5 wt. % surfactant-added TMAH solution as described in the Sekimura article along with arrows denoting crystallographic orientations.

FIG. 7A is a top-down view of an SRAM structure according to the present invention after formation of shallow trench isolation (STI).

FIG. 7B is a cross-sectional view of the SRAM structure in FIG. 7A along the line B-B'.

FIG. 7C is a cross-sectional view of the SRAM structure in FIG. 7A along the line C-C'.

FIG. 8A is a top-down view of the SRAM structure according to the present invention after recessing the shallow trench isolation (STI) according the first and second embodiment of the present invention.

FIG. 8B is a cross-sectional view of the SRAM structure in FIG. 8A along the line B-B'.

FIG. 8C is a cross-sectional view of the SRAM structure in FIG. 8A along the line C-C'.

FIG. 9A is a top-down view of the SRAM structure according to the present invention after masking the area for PFETs with a masking material and exposing the NFETs to a crystallographically anisotropic etching according the first embodiment of the present invention.

FIG. 9B is a cross-sectional view of the SRAM structure in FIG. 9A along the line B-B'.

FIG. 9C is a cross-sectional view of the SRAM structure in FIG. 9A along the line C-C'.

FIG. 10A is a top-down view of the SRAM structure according to the present invention after the masking material is removed according the first embodiment of the present invention.

FIG. 10B is a cross-sectional view of the SRAM structure in FIG. 10A along the line B-B'.

FIG. 10C is a cross-sectional view of the SRAM structure in FIG. 10A along the line C-C'.

FIG. 11A is a top-down view of the SRAM structure according to the present invention after the gates are formed on the PFETs and NFETs according the first embodiment of the present invention.

FIG. 11B is a cross-sectional view of the SRAM structure in FIG. 11A along the line B-B' showing the lambda shaped profile of the channel 491.

FIG. 11C is a cross-sectional view of the SRAM structure in FIG. 11A along the line C-C'.

FIG. 12A is a top-down view of the SRAM structure according to the present invention after masking the area for NFETs with a masking material and exposing the PFETs to a crystallographically anisotropic etching according the second embodiment of the present invention.

FIG. 12B is a cross-sectional view of the SRAM structure in FIG. 12A along the line B-B'.

FIG. 12C is a cross-sectional view of the SRAM structure in FIG. 12A along the line C-C'.

FIG. 13A is a top-down view of the SRAM structure according to the present invention after masking the area for PFETs with a masking material and recessing the silicon in the PFET area according the fourth embodiment of the present invention.

FIG. 13B is a cross-sectional view of the SRAM structure in FIG. 13A along the line B-B'.

FIG. 13C is a cross-sectional view of the SRAM structure in FIG. 13A along the line C-C'.

FIG. 14A is a top-down view of the SRAM structure according to the fourth embodiment of the present invention after growing faceted semiconductor material epitaxially in the PFET area according the third embodiment of the present invention.

FIG. 14B is a cross-sectional view of the SRAM structure in FIG. 14A along the line B-B'.

FIG. 14C is a cross-sectional view of the SRAM structure in FIG. 14A along the line C-C'.

DETAILED DESCRIPTION OF THE INVENTION

Before describing the present invention in detail, a discussion of the prior SRAM devices and a discussion on surface orientation engineering on semiconductor material are provided. The discussion on the prior SRAM devices is made herein to clearly illustrate the fundamental difference between the prior art and the present invention. The discussion on the surface orientation engineering is provided herein to provide supporting evidence for technical enablement of the present invention.

Figure 1A:
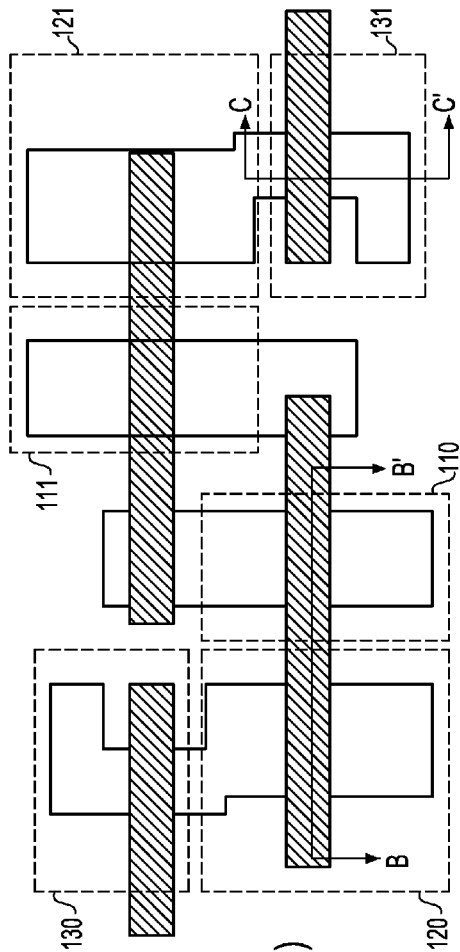
FIG. 1A is a top-down view of a prior art SRAM structure.
Figure 1C:
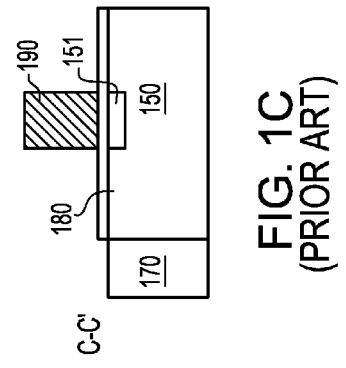
FIG. 1C is a cross-sectional view of the SRAM structure of FIG. 1A along the line C-C'.
Figure 1B:
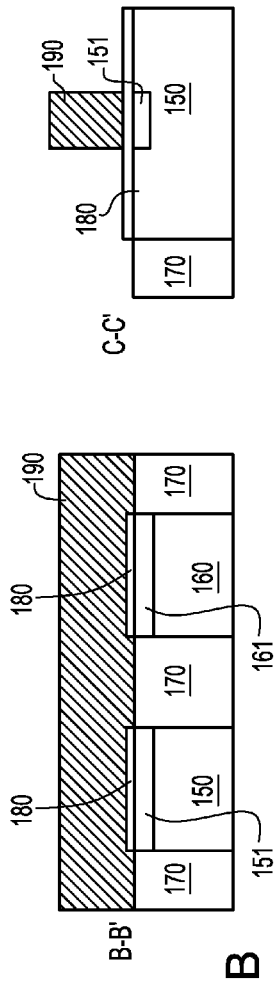
FIG. 1B is a cross-sectional view of the SRAM structure of FIG. 1A along the line B-B'.

Referring to FIGS. 1A-1C, an exemplary SRAM device structure according to the prior art is schematically shown. Only the areas of the substrate in which devices are formed and the structures above the substrate are shown for clarity while the lower portion of the substrate located below the devices are not shown in the cross-sectional view diagrams, FIGS. 1B-1C. These six transistors include a first pull up PFET 110, a first pull down NFET 120, a first pass gate NFET 130, a second pull up PFET 111, a second pull down NFET 121, and a second pass gate NFET 131. Located within the substrate are the NFET body 150, the NFET channel 151, the PFET body 160, the PFET channel 161, and shallow trench isolation (STI) 170. Disposed on top of the substrate are the gate dielectric 180 and the gate lines 190. The sources and the drains of the transistors are not shown for simplicity.

The circuit schematic for the above SRAM device is shown in FIG. 2. The drain of a first pull up PFET 210 is connected in series with the drain of a first pull down NFET 220. The connection point forms a first internal node of the SRAM cell. The drain of a second pull up PFET 211 is connected in series with the drain of a second pull down NFET 221. The connection point forms a second internal node of the SRAM cell. Both source of the first pull up PFET 210 and the second pull up PFET 211 are connected to a positive voltage supply 249. Both sources of the first pull down NFET 220 and the second pull down NFET 221 are connected to ground. Both gates of the first pull up PFET 210 and the first pull down NFET 220 are connected to the second internal node. A first pass gate transistor 231 is connected to the second internal node. Both gates of the second pull up PFET 211 and the second pull down NFET 221 are connected to the first internal node. A second pass gate transistor 230 is connected to the first internal node. Both gates of the first pass gate transistor 231 and the second pass gate transistor 230 are connected to a word line 229. The first pass gate transistor 231 is connected to a first bit line 239. The second pass gate transistor 230 is connected to a second bit line 238.

In conventional semiconductor structures that utilize the same surface orientations, the orientation of the surface adjoining the PFET channel 161, and the orientation of the surface adjoining the NFET channel 151 are identical to the substrate orientation of the underlying substrate below the transistors. The crystallographic orientations of the PFET body 160, NFET body 150, and the underlying substrate (not shown) are identical. In this case, all channels on the substrate, including the PFET channel 161 and NFET channel 151 are built on the same surface orientation, which means that it is impossible for the two types of channels to achieve maximized minority carrier mobility at the same time.

In devices built according to hybrid orientation technology known in the prior art, the orientations of the surface adjoining the PFET channel 151 and the orientations of the surface adjoining the NFET channel 161 are different. Also, at least one of the orientations of the surface adjoining the PFET channel 151 and the orientations of the surface adjoining the NFET channel 161 is different from the substrate orientation. As is obvious from the layout of this SRAM structure, PFETs and NFETs need to be placed within close proximity of one another. While hybrid orientation technology does allow PFETs and NFETs to utilize surface orientations of maximum minority carrier mobility respective and at the same time, due to the ubiquitous and long boundaries between the silicon area and shallow trench isolation (STI), high level of defect density in the substrate along the boundary would impact the transistor performance significantly.

Examples of surface orientation engineering known in the prior art are shown below. Specifically, these examples demonstrate that facets of silicon material with different surface orientations than that of the substrate can be generated by etching processes.

Figure 3C:
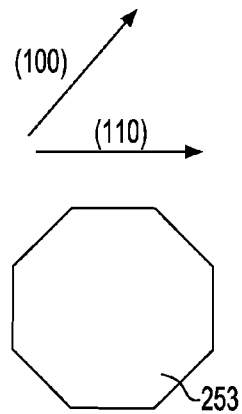
FIG. 3C is a schematic top-down view of a silicon surface etched with a 45 degree rotated square window in the mask in a pure TMAH solution as described in the Sekimura article along with arrows denoting crystallographic orientations.
Figure 3D:
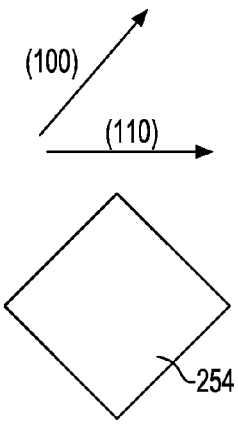
FIG. 3D is a schematic top-down view of a silicon surface etched with a 45 degree rotated square window in the mask in a 0.5 wt. % surfactant-added TMAH solution as described in the Sekimura article along with arrows denoting crystallographic orientations.

In a first example according to Sekimura, the ratio of the etch rate ratio of {100} planes to that of {110} planes changed by more than an order of magnitude through the modulation of the amount of surfactant added to the wet etch chemicals. FIGS. 3A-3D are schematics illustrating the result of the experiments in Sekimura. FIGS. 3A-3B represent schematic top-down views of a silicon surface etched with a circular mask island. Use of a pure TMAH (tetramethyl-ammonium hydroxide; $(CH_3)_4NOH$) solution produced an octagonal pattern 251, as schematically shown in FIG. 3A, of unetched silicon material, while the use of a 0.5 wt. % surfactant-added TMAH solution produced a circular pattern 252, shown in FIG. 3B, of intact silicon material. It is noteworthy that facets in {110} orientations were generated with a pure TMAH solution although the mask used during the etch process was circular with no preferred directions. Similarly, patterns obtained from the use of a 45 degree rotated square window in the mask, which means that the edges of the mask were parallel to the {110} orientations, are shown in FIGS. 3C-3D. Once again, use of a pure TMAH solution produced an octagonal pattern 253 with newly generated {110} facets, as schematically shown in FIG. 3C, of unetched silicon material, while the use of a 0.5 wt. % surfactant-added TMAH solution preserved shape of the 45 degree rotated square 254 in the window of the etch mask in the unetched silicon material as shown in FIG. 3D.

Figure 4A:
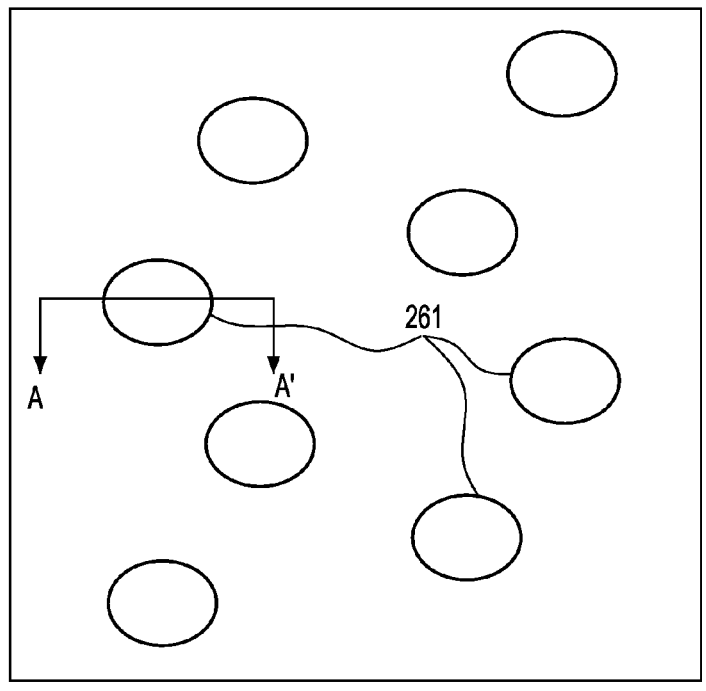
FIG. 4A is a schematic top-down view of a "6F$^2$ Herringbone" pattern arrangement of deep trenches after etching of the silicon substrate.
Figure 4B:
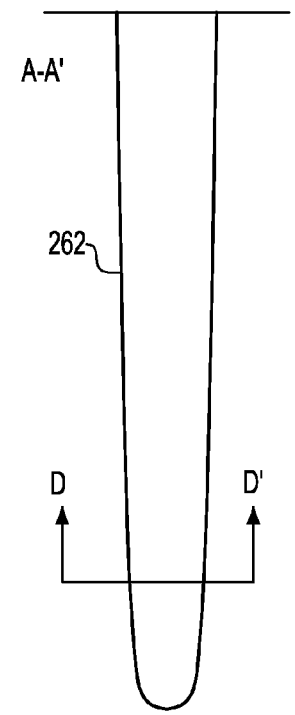
FIG. 4B is a schematic cross-sectional view of one of the deep trenches along the line A-A' in FIG. 4A.

In a second example, the inner surfaces of deep trenches in a silicon substrate, as is commonly used in DRAM manufacturing processes, were subjected to different wet etching chemistry. In a specific example shown here, deep trenches 261 were arranged in a "$6F^2$ Herringbone" pattern as shown in a schematic top down view in FIG. 4A. A cross-sectional view of a deep trench 261 along the A-A' plane is shown schematically in FIG. 4B. Three samples, sample a, sample B, and sample C, each containing the deep trenches, were subjected to different etching processes. Specifically, sample A was first etched in a dilute hydrofluoric acid (DHF) followed by etching in an ammonium hydroxide ($NH_4OH$) solution for 120 seconds. Sample B was pretreated with SC1 clean consisting of a mixture of $H_2O$, $NH_4OH$, and $H_2O_2$, followed by etching in a dilute hydrofluoric acid (DHF), then followed by etching in an ammonium hydroxide ($NH_4OH$) solution for 120 seconds. Sample C was etched in a dilute hydrofluoric acid (DHF), then dried in an environment containing isopropyl alcohol (IPA) vapor, then etched in an ammonium hydroxide ($NH_4OH$) solution for 120 seconds.

Figures 5A, 5B, 5C:
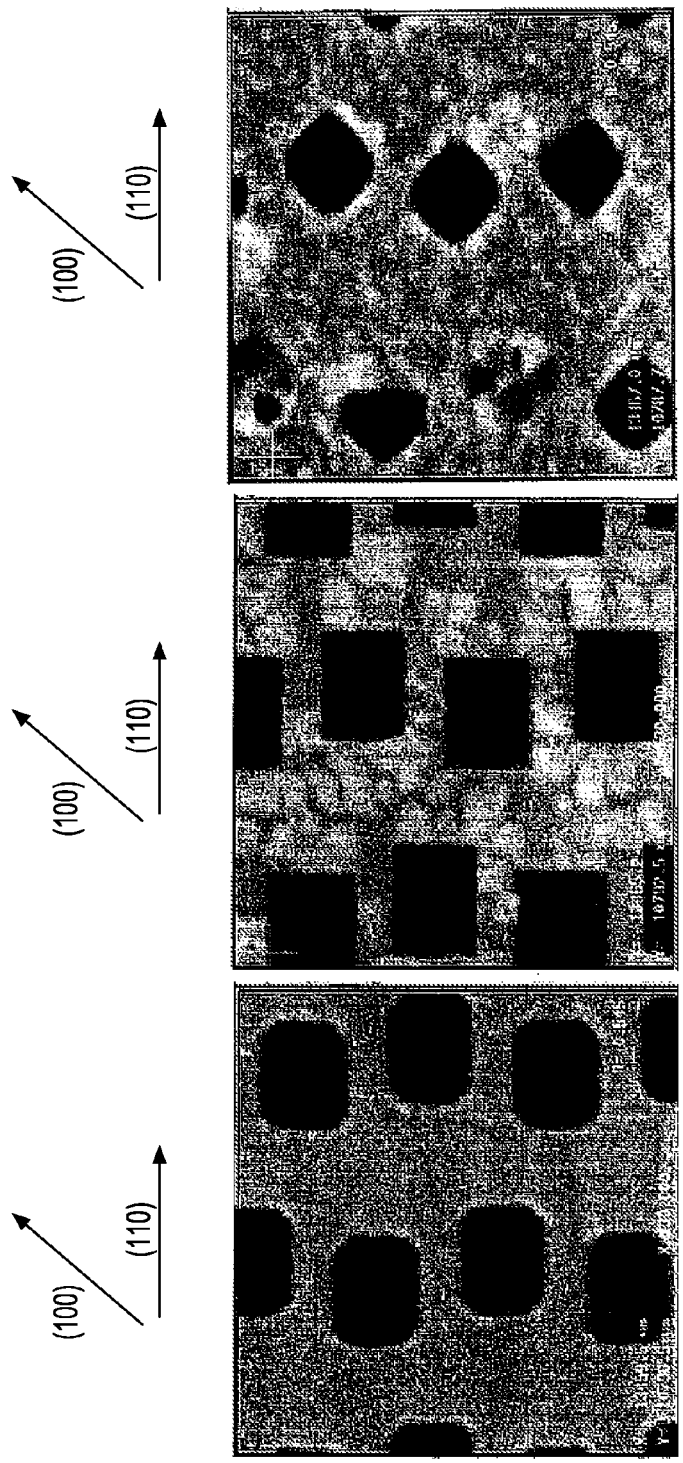
FIG. 5A is a cross-sectional view of deep trenches arranged in the "6F$^2$ Herringbone" pattern after DHF treatment followed by 120 seconds of etching in the NH$_4$OH solution taken along the direction of the line D-D' in FIG. 4B.
FIG. 5B is a cross-sectional view of deep trenches arranged in the "6F$^2$ Herringbone" pattern after SC1 treatment followed by DHF treatment, and then followed by 120 seconds of etching in the NH$_4$OH solution taken along the direction of the line D-D' in FIG. 4B.
FIG. 5C is a cross-sectional view of deep trenches arranged in the "6F$^2$ Herringbone" pattern after DHF treatment followed by IPA dry, and then followed by 120 seconds of etching in the NH$_4$OH solution taken along the direction of the line D-D' in FIG. 4B.

These samples were cross-sectioned for taking scanning electron micrographs (SEM) perpendicular to the direction of the depth of the trenches. The direction of the cross-section is schematically shown as the plane indicated by the D-D' line in FIG. 4B. FIG. 5A shows the SEM of sample A along with two arrows showing the crystallographic orientations of the silicon substrate. Similarly, FIG. 5B and FIG. 5C show the SEMs of sample B and sample C along with two arrows showing the crystallographic orientations of the silicon substrate respectively. Depending on the etching process, different crystallographic orientations of the exposed surfaces were obtained. Specifically, facets with {110} surface orientations were generated in sample B; facets with {100} surface orientations were generated in sample C; and a mixture of facets with {110} surface orientations and facets with {100} surface orientations was generated in sample A. Therefore, it is possible by controlling the wet etch process to generate planes containing preferred surface orientations.

It has also been demonstrated that by controlling ex-situ clean prior to the selective epitaxy process, the resulting facets, or surface orientations can be controlled. Specifically, surface orientations of {111} and {311} were reported by selective epitaxy process on a silicon substrate in Mazuré et al., "Facet Engineered Elevated Source/Drain by Selective Si Epitaxy for 0.35 Micron MOSFETS," IEEE IEDM 92-853, 1992, pp. 33.7.1-33.7.4.

During a selective epitaxy process, both a deposition of the new semiconductor material and the etching of the new semiconductor material are present. On the surface of the original semiconducting material and on the deposited new semiconducting material, the deposition rate of the new semiconducting material is higher than the etch rate of the same. However, on the surface of the masking material, the etch rate of the new semiconducting material is higher than the depositon rate, or even the nucleation rate of the new semiconducting material. Hence, no new semiconducting material is deposited on the surface of the masking material.

Commonly used semiconductor substrates include silicon, silicon germanium alloy, silicon carbon alloy, silicon germanium carbon alloy with various doping. The same semiconductor material may be used as the new semiconductor material that is deposited on top of the original semiconducting material. Control of lattice mismatch is essential in controlling defect density in any epitaxial deposition process including selective epitaxy. The masking material commonly used in the selective epitaxy process includes silicon nitride, silicon oxide, and other dielectric materials.

Pretreatment of the surface of the original semiconductor material before the selective epitaxy process affects the nucleation of the new material on it, thus affecting the selective epitaxial growth process. Results in Mazuré et al., are a demonstration of a formation of different surface orientations than the substrate orientation through selective epitaxy process.

The body of evidences cited above clearly demonstrates that the formation of surface orientations substantially different from the substrate orientation of a provided substrate can be formed by wet etch, or reactive ion etch, or by selective epitaxy.

Before describing the present invention in detail, definitions of terms used in this disclosure are presented herein as well.

The word, "substrate orientation", herein denotes the orientation of the surface of the substrate in the case of a bulk semiconductor substrate consisting of only one single crystal across the entirety of the substrate. In the case of a silicon on insulator (SOI) wafer containing at least one buried oxide layer and in which all the semiconductor material between the top surface, on which semiconductor devices are built, and the first underlying buried oxide (BOX) layer has the same crystallographic orientations, the "substrate orientation" herein denotes the orientation of the surface of the semiconductor material between the top surface and the first underlying BOX. In the case of an SOI wafer with multiple regions of semiconductor material with different crystallographic orientations among them, as is the case with substrates manufactured with hybrid orientation technology, the "substrate orientation" herein denotes the local orientation of the semiconductor material, out of which or above which a referenced semiconductor device is located. In practical terms, "substrate orientation" refers to the original orientation of the semiconductor surface, above and/or out of which the referenced semiconductor device is manufactured.

Figure 6A:
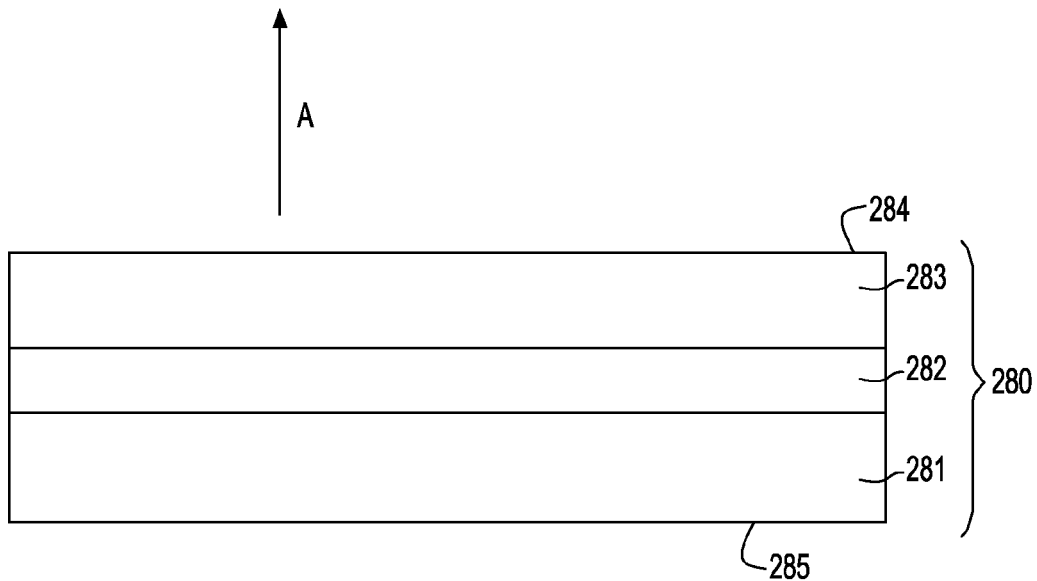
FIG. 6A is a cross-sectional view of a substrate having a substrate orientation in the direction of the arrow A, which is perpendicular to the top and bottom surfaces of the substrate before any pattern is formed on the wafer.

The definition of "substrate orientation" is pictorially illustrated in FIG. 6A. An SOI substrate 280 comprises the bottom semiconductor portion 281, a buried oxide layer 282, a top semiconductor portion 283, and a top surface 284, and a bottom surface 285. The top surface 284 is substantially flat and extends parallel to the bottom surface 285. The top semiconductor portion 283 contains the semiconductor material on which semiconductor devices are to be subsequently built. An arrow labeled "A" is placed in FIG. 6A perpendicular to the top surface 284. The crystallographic orientation of the top semiconductor portion in the direction of the arrow A is the "substrate orientation." The crystallographic orientation of the bottom semiconductor portion 281 does not matter for the determination of the "substrate orientation" for the purposes of the present invention. If a wafer has multiple areas with multiple crystallographic orientations, the "substrate orientation" is defined locally utilizing the crystallographic orientation of the local top semiconductor portion in the direction of the arrow A.

In contrast to the substrate orientation, the surface orientation is defined locally from any substantially extending surface of semiconductor surface. The crystallographic orientation of the local semiconductor material in the direction of the vector normal to the local surface of that local semiconductor material defines the "surface orientation" of the local surface.

Figure 6B:
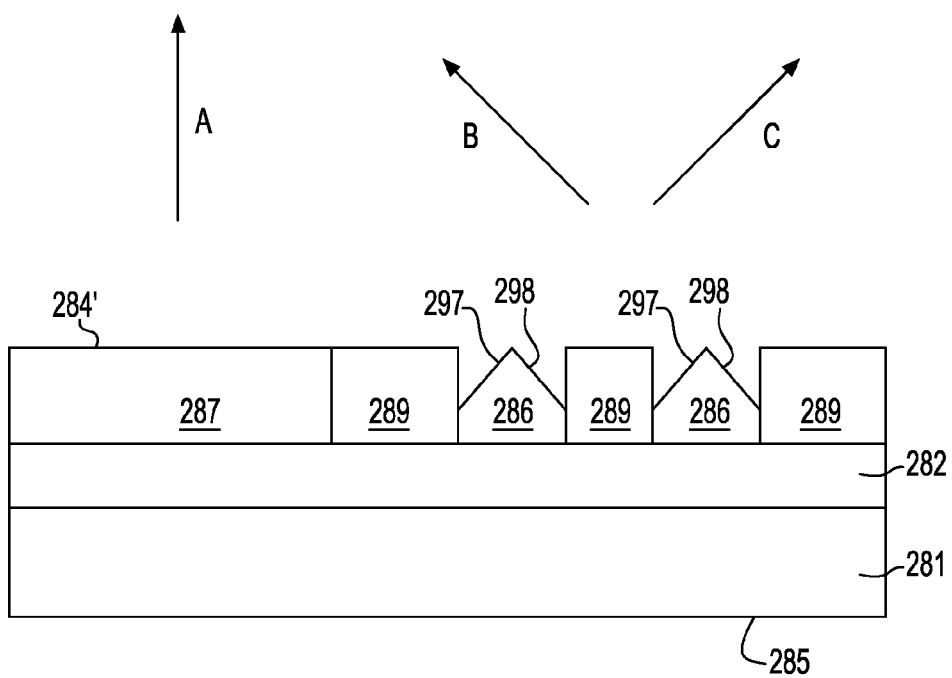
FIG. 6B is a cross-sectional view of a substrate having new surface orientations B and C corresponding to first new surfaces 297 and second new surfaces 298 in a portion 286 of the semiconductor substrate according to the present invention.

FIG. 6B illustrates a structure with multiple surface orientations according to the present invention. The area of the top semiconductor portion 283 in FIG. 6A is divided into two portions after processing. A first portion 287 of top semiconductor with a first surface 284' has a surface orientation corresponding to the crystallographic orientation of the first portion in the direction of the arrow A. A second portion 286 of a top semiconductor with multiple second surfaces 297 and multiple third surfaces 298 has two surface orientations corresponding to the crystallographic orientations of the second portion in the direction of the arrows B and C. Obviously, both the first portion and second portion have the same crystallographic orientations in the same direction because the crystalline structure did not rotate during processing. Therefore, the direction of the arrow A is the direction of the substrate orientation, while the direction of the arrow B or C is at an angle with the substrate orientation.

It is noteworthy that standard semiconductor processing sometimes produces a surface orientation for the semiconductor material that is not quite the same as the original surface orientation due to imperfect processing conditions. The angle between this type of surfaces and the original surface orientation of the substrate, i.e., the substrate orientation, may be different from zero degree but is very close to zero degree, that is, less than 8 degrees and most likely to be less than 1 degree. The variations in this type of angle are subjected to process variations and are hard to predict or control, and does not coincide with any major crystallographic orientations, and most of all, does not serve useful purposes. This type of angle is herein referred to be "substantially zero degree" and refers to an angle generated by imperfections in processing rather than by design. In contrast, the type of angles outside the range of "substantially zero degree" is referred to be "substantially greater than zero degree."

Similarly, standard semiconductor processing also produces surface orientations for the semiconductor material that is vertical or almost vertical. The angle between this type of surfaces and the original surface orientation of the substrate, i.e., the substrate orientation, is either 90 degrees or very close to 90 degrees, that is, between 82 degrees and 98 degrees and most likely between 88 degrees and 92 degrees. Once again, the variations in this type of angle are subjected to process variations and are hard to predict or control, does not coincide with any major crystallographic orientations, and most of all, does not serve any useful purpose. This type of angle is herein referred to be "substantially orthogonal" and refers to an angle generated by imperfections in processing rather than by design. In contrast, an angle outside the range of "substantially orthogonal" is referred to be "substantially not orthogonal."

The type of surface orientation that the present invention enables is at an angle substantially greater than zero degree and substantially not orthogonal to the substrate orientations. For example, if the substrate orientation is (100) and the surface orientations after etching are {110} type planes, the angle between the substrate orientation and any of the surface orientation is 45 degrees. In general, the angle between two vectors in a cubic lattice can easily be calculated by the dot product of two vectors since the dot product is the length of the first vector times the length of the second vector times the cosine of the angle between the two vectors. The following tabulates angles between major crystallographic planes. Zero degree and 90 degree angles that are not intended to be obtained by the present invention are marked with N/A in Table 1.

TABLE 1

Angles between substrate orientation and major crystallographic orientations according to the present invention

|  | Surface orientation {100} | Surface orientation {110} | Surface orientation {111} | Surface orientation {211} | Surface orientation {221} | Surface orientation {311} |
|---|---|---|---|---|---|---|
| Substrate orientation (100) | N/A | 45 degrees | ~54.73 degrees | ~35.26 or ~65.90 degrees | ~48.18 or ~70.53 degrees | ~25.24 or ~72.45 degrees |

TABLE 1-continued

Angles between substrate orientation and major crystallographic orientations according to the present invention

| | Surface orientation {100} | Surface orientation {110} | Surface orientation {111} | Surface orientation {211} | Surface orientation {221} | Surface orientation {311} |
|---|---|---|---|---|---|---|
| Substrate orientation (110) | 45 degrees | N/A | ~35.26 degrees | ~30.01, ~54.74 or ~73.22 degrees | ~19.47, 45 or ~76.36 degrees | ~31.48 or ~64.76 degrees |
| Substrate orientation (111) | ~54.73 degrees | ~35.26 degrees | N/A | ~19.47 or ~61.87 degrees | ~15.79, ~54.74 or ~78.90 degrees | ~29.49, ~58.52 or ~79.98 degrees |

Proceeding with the detailed description of the present invention, FIGS. 7A-7C show a schematic of an exemplary SRAM according to the present invention after the formation of shallow trench isolation 370 through dielectric deposition and planarization. The process for STI formation is well known in the art. In the cross-sectional schematic diagrams in FIGS. 7B-7C, the area of the substrate below the STI is not shown for simplicity. The PFET body 360 and the NFET body 350 are separated by the STI 370. Both the PFET body 360 and the NFET body 350 comprise portions of a single crystalline substrate. Preferably, both the PFET body 360 and the NFET body 350 have the same substrate orientation.

According to a first embodiment of the present invention, the substrate orientation is (100), which is the optimal surface orientation for NFET devices while being the least desired orientation for PFET devices. The surface of the STI 370 may optionally be recessed by etching as shown in FIGS. 8A-8C to reduce topographic variations in the later stages of processing, particularly when the gate needs to be lithographically patterned. The etching process may utilize a wet etch or a reactive ion etch (RIE) to provide desired recess depth of the STI 370.

The NFET body 350 is masked with masking material 401 as schematically shown in FIGS. 9A-9C. The top surfaces of the unmasked PFET body 360 in FIGS. 7A-7C are subjected to etchant that produces surface orientations other than (100). The resulting structure is described in FIGS. 9A-9C, which shows the etched PFET body 460 with facets 461 and ridges 462 where two facets with different surface orientations meet.

In FIG. 9A, the two rectangular semiconductor areas are exposed after lithographic pattering with masking material 401. If the geometry of an exposed semiconductor surface is a rectangle and not a square, the etching produces four facets, two of them, "the triangle facets" 463, are shaped like triangles while the other two, "the trapezoid facets" 461, are shaped like trapezoids. The two long parallel edges 464 of each rectangle serves as the longer base of each trapezoid facets 461 while the ridge 462 formed where the two trapezoids 461 meet serves as the shorter top of each trapezoid.

Examination of the cross-section perpendicular to the direction of the two long parallel edges 464 as shown in FIG. 9B shows the critical feature of the present invention, which is the lambda shaped profile of the two trapezoid facets 464. According to the first embodiment of the present invention, the substrate orientation is a (100) orientation. The surface orientations of the triangle facets and the trapezoid facets are preferably {110}, {111}, {211}, {221} or {311}, and most preferably {110}. The on-current of a transistor built on such facets benefits from the increase of the channel width by a factor of the inverse of the cosine of the angle between the surface orientation of the facet and the substrate orientation. Furthermore, the on-current of the same transistor benefits from the increased carrier mobility due to the new orientation of the surface beneath which the channel is formed. At the same time, the variation in the height is minimized due to the lambda shaped profile in the cross-section of the channel. The formation of a lambda shaped channel is a critical feature of the present invention in general and applies to all other embodiments described below as well as the first embodiment of the present invention.

The masking material 401 may comprise a photoresist, a dielectric material, a stack of dielectric materials, a stack of dielectrics and a semiconductor material, or a stack of dielectric materials and a photoresist. Most common dielectric materials used in the semiconductor industry comprise silicon oxide, silicon nitride, silicon oxynitride and some high-K dielectric material.

The application of an etchant during the etching process may be done through a wet etch process or a reactive ion etching process. Both types of etching processes need to have anisotropic etching rates along different crystallographic orientations of the substrate. Additionally, the selected etching process needs to have at least one crystallographic orientation along which a silicon material etches faster than along the (100) orientation.

A first example of such a process is a wet etch process utilizing a pure TMAH solution, which produces {110} facets due to the higher rate of etching along {110} surface orientations than along {100} surface orientations. A second example is a wet etch process which comprises a pretreatment with SC1 clean consisting of a mixture of $H_2O$, $NH_4OH$, and $H_2O_2$, followed by etching in a dilute hydrofluoric acid (DHF), then followed by etching in an ammonium hydroxide solution ($NH_4OH$). This process also has higher etch rate along {110} surface orientations than along {100} surface orientations. A third example is a reactive ion etching used for deep trench formation in the DRAM processes, which tends to produce {110} facets on the surface of the silicon material.

Notice that the angles between the substrate orientation and the surface orientations (100) of the preferred facets, as tabulated in Table 1, are greater than 8 degrees and less than 92 degrees and is at an angle substantially greater than zero degree but is substantially not orthogonal to the substrate orientation as defined above.

Afterwards, the masking material 401 is removed. The resulting structure is shown in FIGS. 10A-10C. Thereafter, gate dielectric 480 is formed on both the NFET body 350 and the etched PFET body 460, followed by gate conductor deposition and patterning of the gate stack to form gate lines 490. After the spacer formation and source/drain formation, followed by contact formation, the PFET structures and NFET structures are completed. FIGS. 11A-11C. show completed PFET and NFET structures according to the first embodiment of the present invention as described above. The PFET channel 491 of a completed PFET structure and the NFET channel area 481 of a completed NFET structure are also shown in FIGS. 11A-11C. The source, drain, and contacts are not shown in FIGS. 11A-11C for simplicity. It is obvious, though, that the source and drain should be built on either side of the gate over the exposed semiconductor area. The resulting structure contains PFET devices with the channel built under silicon surfaces with their surface orientation different than the substrate orientation.

According to the first embodiment of the present invention, the physical channel is formed out of portions of the two trapezoid facets that overlap the gate 490. The current of the PFET flows along the pair of parallel edges 464 in FIG. 11A. The direction of the current flow is perpendicular to the lambda shaped profile of the PFET channel 491 that can be seen in FIG. 11B, i.e., the current of the PFET flow in or out of the plane of FIG. 11B. The gate dielectric 480 over the PFET area has a lambda shaped profile as well.

As mentioned earlier, recessing of the STI 370 may be employed before the masking and etching process for the portions of the silicon body to help reduce the variations in the height of the gate stack. Less variations in height in the vertical profile of the gate stack requires less field of depth on lithographic tools. Alternatively, chemical mechanical planarization (CMP) may be employed to achieve higher planarity before the lithographic patterning of the gates.

According to a second embodiment of the present invention, the substrate orientation is (110), which is the optimal surface orientation for PFET devices while being the least desired orientation for NFET devices. The surface of the STI 370 may optionally be recessed by etching as shown in FIGS. 8A-8C in accordance with the first embodiment of the present invention.

Instead of masking the NFET body 350, the PFET body 360 is masked with masking material 501 as shown in FIGS. 12A-12C. The top surfaces of the unmasked NFET body 350 in FIGS. 7A-7C are subjected to etchant that produces surface orientations other than (110). The surface orientations of such facets are preferably {100}, {111}, {211}, {221} or {311}, and most preferably {100}. The resulting structure is described in FIGS. 12A-12C, which shows the etched NFET body 550 with facets 561 and ridges 562 where two facets with different surface orientations meet.

The presence of facets with more complex shapes than triangles or trapezoids is the result of a non-rectangular semiconductor area exposed during the etching process. The purpose of the demonstration of complex shape of facets is to show that evening complex geometries of the exposed silicon surfaces, a lambda shaped profile for the channel is readily formed as long as two parallel edges of the exposed semiconductor surface are present and closer together than other pairs of parallel edges on the same exposed semiconductor surface. The present invention is readily extendable to exposed surface shapes other than rectangles to generate lambda shaped cross-sectional profile for the channel of a transistor.

The same masking material 501 may be used as in the first embodiment. Also, the application of the etchant during the etching process may be performed through a wet etch process or a reactive ion etching process. As in the first embodiment of the present invention, both types of etching processes need to have anisotropic etching rates along different crystallographic orientations of the substrate. However, the selected etching process needs to have at least one crystallographic orientation along which silicon material etches faster than along the (110) orientation.

An example of such a process is a wet etch process which comprises a pretreatment in a dilute hydrofluoric acid (DHF), followed by drying in an environment containing isopropyl alcohol (IPA) vapor, then followed by an etch in an ammonium hydroxide (NH$_4$OH) solution.

The angles between the substrate orientation (110) and any of the surface orientations of the preferred facets, as tabulated in Table 1, are greater than 8 degrees and less than 92 degrees. Therefore, the substrate orientation (110) and any of the surface orientations of the preferred facets are at an angle substantially greater than zero degree but is substantially not orthogonal relative to each other.

Afterwards, the same process flow as in the first embodiment is employed. The resulting structure, however, contains NFET devices with the channel built under silicon surfaces with their surface orientation different than the substrate orientation.

According to a third embodiment of the present invention, the substrate is a (111) silicon substrate. At least one of the NFET body 350 and the PFET body 360 in FIGS. 7A-7C is masked with a masking material and then subjected to an anisotropic etch that has at least one crystallographic orientation along which the etch rate is higher than the etch rate along the exposed orientation of the silicon material. The masking material is then removed and the process flow follows the same processing steps as described in the first embodiment.

The angles between the substrate orientation (111) and any of the surface orientations of the preferred facets, as tabulated in Table 1, are greater than 8 degrees and less than 92 degrees. Therefore, the substrate orientation (111) and any of the surface orientations of the preferred facets are at an angle substantially greater than zero degree but is substantially not orthogonal relative to each other.

According to a fourth embodiment of the present invention, the substrate is a (100) silicon substrate. The NFET body 350 as shown in FIGS. 7A-7C is masked with a masking material 601. The PFET body 360 is recessed by exposing them to etchant, either in a wet etch process or in a reactive ion etch process. The resulting structure with recessed PFET body 660 with a recessed silicon surface 659 are shown in FIGS. 13A-13C along with the masking material 601, an STI 370, the NFET body 350.

This is followed by a suitable surface pretreatment and then a selective epitaxy process that grows facets with surface orientations other than {100} orientations. The surface orientations of such facets are preferably {110}, {111}, {211}, {221} or {311}, and most preferably {110}. The resulting structure is described in FIGS. 14A-14C, which shows selective epitaxially grown PFET body 660 with facets 661 and ridges 662 where two facets with different surface orientations meet. After the formation of the selective epitaxially grown PFET body 660, the masking material 601 is removed. The process flow then follows the same processing steps as described in the first embodiment.

The requirement of the masking material 601 in the fourth embodiment is stricter than the masking material 401 in the first embodiment or the masking material 501 in the second embodiment in that the masking material 601 must serve as an effective mask for the etch processes as well as being an effective masking material for the sake of a selective epitaxy process, of which the requirements are described above. Preferably, a hardmask comprising a dielectric material or a stack of dielectric materials such as silicon oxide, silicon nitride, silicon oxynitride may be used for the masking material according to the fourth embodiment of the present invention. Alternatively, a masking material suitable only for the etch processes may be used first, followed by a deposition and patterning of the hardmask.

The angles between the substrate orientation (100) and any of the surface orientations of the preferred facets, as tabulated in Table 1, are greater than 8 degrees and less than 92 degrees. Therefore, the substrate orientation (100) and any of the surface orientations of the preferred facets are at an angle substantially greater than zero degree but is substantially not orthogonal relative to each other.

According to a fifth embodiment of the present invention, the substrate is a (110) silicon substrate. The PFET body 360 as shown in FIGS. 7A-7C is masked with a masking material. The NFET body in FIGS. 7A-7C is recessed by exposing them to etchant, either in a wet etch process or in a reactive ion etch process. This results in structures with recessed NFET body with a recessed silicon surface.

As in the fourth embodiment of the present invention, this is followed by a suitable surface pretreatment and then a selective epitaxy process that grows facets with surface orientations other than {110} orientations. The surface orientations of such facets are preferably {100}, {111}, {211}, {221} or {311}, and most preferably {100}. After the formation of the selective epitaxially grown NFET body, the masking material is removed. The process flow then follows the same processing steps as described in the first embodiment. The same requirement applies to the masking material in the fifth embodiment as in that in the fourth embodiment.

The angles between the substrate orientation (110) and any of the surface orientations of the preferred facets, as tabulated in Table 1, are greater than 8 degrees and less than 92 degrees. Therefore, the substrate orientation (110) and any of the surface orientations of the preferred facets are at an angle substantially greater than zero degree but is substantially not orthogonal relative to each other.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of fabricating a semiconductor structure, comprising:
    forming a first single crystalline semiconductor portion and a second single crystalline semiconductor portion that are laterally surrounded by a shallow trench isolation (STI) structure embedded in a semiconductor substrate wherein said first and second single crystalline semiconductor portions have a substrate orientation;
    subjecting, in a single etch step and while masking said second single crystalline semiconductor portion with a masking material, said first single crystalline semiconductor portion to at least one etchant to form at least two new facets which are joined with a lambda shaped cross-sectional profile with surface orientations that are at an angle substantially greater than zero degree to said substrate orientation and is substantially not orthogonal to said substrate orientation, wherein said at least two facets protrude above a top surface of said STI structure, terminate at sidewalls of said STI structure, and two of said at least two facets are adjoined at a ridge located above said top surface of said STI structure at an end of said single etching step; and
    forming a first gate dielectric on said at least two new facets and a second gate dielectric on said second single crystalline semiconductor portion.

2. The method of claim 1, wherein said at least one etchant comprises at least one wet etching chemical that has anisotropic etching rates along different crystallographic axes of said semiconductor substrate.

3. The method of claim 2, further comprising:
    pretreating said semiconductor substrate with a chemical that modifies the ratio of etch rates along different crystallographic planes of said semiconductor substrate prior to subjecting said single crystalline semiconductor portion of said semiconductor substrate to said at least one etchant.

4. The method of claim 1, wherein said substrate orientation is a (100) orientation and said surface orientations are {110} orientations.

5. The method of claim 1, wherein said substrate orientation is a (110) orientation and said surface orientations are {100} orientations.

6. The method of claim 1, wherein said STI structure is formed by recessing an area of said semiconductor material portion and filling said area with a dielectric material, wherein remaining portions of said semiconductor material portion constitute said first and second single crystalline semiconductor portions.

7. The method of claim 6, wherein top surfaces of said first and second single crystalline semiconductor portions are substantially coplanar with a top surface of said STI structure prior to said subjecting said first single crystalline semiconductor portion to said at least one etchant.

8. The method of claim 6, further comprising recessing a top surface of said STI structure relative to top surfaces of said first and second single crystalline semiconductor portions prior to said subjecting said first single crystalline semiconductor portion to said at least one etchant.

9. The method of claim 1, wherein said second dielectric is formed on a top surface and substantially vertical sidewall surfaces of said second single crystalline semiconductor portion.

10. The method of claim 1, further comprising:
    forming a first field effect transistor (FET) on said semiconductor substrate using said first single crystalline semiconductor portion as a body of said first FET and said first gate dielectric as a gate dielectric of said first FET; and
    forming a second FET on said substrate using said second single crystalline semiconductor portion as a body of said second FET and said first gate dielectric as a gate dielectric of said second FET.

11. The method of claim 10, wherein one of said first and second FETs is a p-type FET and the other of said first and second FETs is an n-type FET.

12. The method of claim 10, wherein each of said first and second FETs has a gate conductor comprising a same conductive material.

13. The method of claim 10, wherein a gate conductor of said first FET is formed over a portion of said ridge.

14. The method of claim 10, wherein a contiguous channel of said second FET is formed beneath a top surface of said second single crystalline semiconductor portion and within portions of sidewalls of said second single crystalline semiconductor portion that protrude above said. STI structure.

15. The method of claim 1, wherein said sidewalls of said STI structure contact an entire periphery of said at least two facets.

16. The method of claim 15, wherein said at least two facets include more than four facets.

* * * * *